US011475833B2

(12) United States Patent
Liu et al.

(10) Patent No.: US 11,475,833 B2
(45) Date of Patent: Oct. 18, 2022

(54) SEMICONDUCTOR APPARATUS, PIXEL CIRCUIT AND CONTROL METHOD THEREOF

(71) Applicant: BOE TECHNOLOGY GROUP CO., LTD., Beijing (CN)

(72) Inventors: Qingzhao Liu, Beijing (CN); Guoqiang Wang, Beijing (CN); Rui Huang, Beijing (CN); Lizhong Wang, Beijing (CN); Shuilang Dong, Beijing (CN); Xinhong Lu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 72 days.

(21) Appl. No.: 16/767,351

(22) PCT Filed: Dec. 18, 2019

(86) PCT No.: PCT/CN2019/126265
§ 371 (c)(1),
(2) Date: May 27, 2020

(87) PCT Pub. No.: WO2020/211415
PCT Pub. Date: Oct. 22, 2020

(65) Prior Publication Data
US 2021/0233467 A1 Jul. 29, 2021

(30) Foreign Application Priority Data
Apr. 17, 2019 (CN) .......................... 201910310959.8

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *H01L 27/1214* (2013.01);
(Continued)

(58) Field of Classification Search
CPC .. G09G 3/3208; G09G 3/3233; G09G 3/3266; G09G 2300/0426; H01L 27/1214;
(Continued)

(56) References Cited

U.S. PATENT DOCUMENTS

2010/0321356 A1 12/2010 Brown et al.
2014/0145198 A1 5/2014 Kim et al.
2017/0123542 A1 5/2017 Xie et al.

FOREIGN PATENT DOCUMENTS

CN 104009067 A 8/2014
CN 104538402 A 4/2015
(Continued)

*Primary Examiner* — Stacy Khoo
(74) *Attorney, Agent, or Firm* — The Webb Law Firm

(57) ABSTRACT

The present application discloses a semiconductor apparatus, a pixel circuit and a control method thereof. The semiconductor apparatus comprises: an active layer; a first insulating layer; a first gate and a second gate overlapping with a portion of the active layer with the first insulating layer interposed therebetween, respectively; a first electrode, a second electrode and a third electrode, the first electrode and the second electrode are electrically connected with a first portion and a second portion of the active layer, respectively, the third electrode is used to be electrically connected with a photosensitive device, wherein the third electrode is electrically connected with the first gate or the second gate; or the third electrode is electrically connected with a third portion of the active layer.

20 Claims, 5 Drawing Sheets

(51) Int. Cl.
*H01L 27/12* (2006.01)
*H01L 29/78* (2006.01)
*H01L 31/12* (2006.01)

(52) U.S. Cl.
CPC .......... *H01L 29/7831* (2013.01); *H01L 31/12* (2013.01); *G09G 2300/0426* (2013.01)

(58) Field of Classification Search
CPC .................... H01L 29/7831; H01L 29/78645; H01L 31/12
See application file for complete search history.

(56) References Cited

FOREIGN PATENT DOCUMENTS

| | | |
|---|---|---|
| CN | 103839949 B | 8/2016 |
| CN | 108376250 A | 8/2018 |
| CN | 108416252 A | 8/2018 |
| CN | 109962114 A | 7/2019 |
| KR | 19960026968 A | 7/1996 |
| KR | 0155306 B1 * | 10/1998 |

* cited by examiner

SEMICONDUCTOR APPARATUS, PIXEL CIRCUIT AND CONTROL METHOD THEREOF

CROSS-REFERENCE TO RELATED APPLICATIONS

This application is the United States national phase of International Application No. PCT/CN2019/126265 filed Dec. 18, 2019, and claims priority to Chinese Patent Application No. 201910310959.8 filed Apr. 17, 2019, the disclosures of which are hereby incorporated by reference in their entirety.

TECHNICAL FIELD

The present application generally relates to the field of display technology, and in particular, to a semiconductor apparatus (more particularly, a dual gate TFT), a pixel circuit and a control method thereof.

BACKGROUND

With the development of display technology, display effect of the display apparatus becomes better and better. However, with the increase in demands for the display apparatus, in addition to the display effect, the display is required to have diversified functions.

For example, the display apparatus combines image display and fingerprint recognition technology to form the display apparatus with the fingerprint recognition function. However, in this display apparatus, both the image display and the fingerprint recognition are performed by individual thin film transistors (TFTs) as drive switches, which results in greatly reduced pixel density and is unfavorable for the high resolution display effect.

SUMMARY

In a first aspect, an embodiment of the present application provides a dual gate thin film transistor disposed on a substrate, the dual gate thin film transistor further comprises:
an active layer disposed on the substrate;
a first gate and a second gate disposed on the substrate;
a first electrode, a second electrode and a third electrode disposed on the substrate; the first electrode and the second electrode are electrically connected with the active layer via a first via and a second via respectively, the third electrode is used to be electrically connected with a photosensitive device, wherein the third electrode is electrically connected with the first gate or the second gate via a third via; or the third electrode is electrically connected with the active layer via a fourth via.

In a second aspect, the present application provides a pixel circuit comprising the dual gate thin film transistor as described in the first aspect, the photosensitive device, an organic light emitting device, wherein the photosensitive device is indirectly electrically connected with the first gate or the second gate;
the double gate thin film transistor is used to synchronously receive a first control signal via the first gate and the second gate, so as to make the double gate thin film transistor work in a sub-threshold region;
the photosensitive device is used to synchronously receive a second control signal while the double gate thin film transistor receives the first control signal, so that the photosensitive device is in a reverse bias state;
in a time period during which the photosensitive device is in the reverse bias state, the photosensitive device converts an optical signal into an electric charge in response to the optical signal detected, so as to make the first gate generate a bias voltage and make the double gate thin film transistor generate a first current value for fingerprint recognition under the bias voltage;
alternatively, the double gate thin film transistor is used to synchronously receive a third control signal via the first gate and the second gate, so that the double gate thin film transistor is in an on state to generate a second current value for driving the organic light emitting device to carry out pixel display.

Further, the photosensitive device is further used to synchronously receive a fourth control signal while the double gate thin film transistor is in the on state, so that the photosensitive device is in a forward bias state.

In a third aspect, the present application provides a pixel circuit comprising the dual gate thin film transistor as described in the first aspect, the photosensitive device, an organic light emitting device, wherein the photosensitive device is indirectly electrically connected with the active layer;
the double gate thin film transistor is used to synchronously receive a fifth control signal via the first gate and the second gate, so that the double gate thin film transistor is in an off state;
the photosensitive device is used to receive a second control signal while the double gate thin film transistor is in the off state, so that the photosensitive device is in a reverse bias state, at this time, the photosensitive device converts the optical signal into the electric charge and accumulates the electric charge in response to the optical signal detected;
the double gate thin film transistor is further used to receive a third control signal via the first gate, and to receive a fifth control signal via the second gate, so that the double gate thin film transistor is in a first partial on state to lead out the electric charge as a third current value for fingerprint recognition; or
the double gate thin film transistor is used to synchronously receive the third control signal via the first gate and the second gate, so that the double gate thin film transistor is in the on state to generate a fourth current value for driving the organic light emitting device to carry out pixel display.

Furthermore, the photosensitive device is further used to synchronously receive a fourth control signal while the double gate thin film transistor is in the first partial on state, so that the photosensitive device is in a forward bias state.

Furthermore, the double gate transistor is further used to receive a fifth control signal by the first gate, to receive a third control signal by the second gate, so that the double gate thin film transistor is in a second partial on state to generate a fifth current value for driving the organic light emitting device to carry out pixel display.

In a fourth aspect, an embodiment of the present application further provides a control method of a pixel circuit, the pixel circuit is as described in the second aspect, then the method comprises:
the first gate and the second gate synchronously receive a first control signal, so as to make the double gate thin film transistor work in a sub-threshold region;

the photosensitive device synchronously receives a second control signal while receiving the first control signal, so that the photosensitive device is in a reverse bias state;

in a time period during which the photosensitive device is in the reverse bias state, the photosensitive device converts the optical signal into the electric charge in response to the optical signal detected, so as to make the first gate generate a bias voltage and to make the double gate thin film transistor generate a first current value under the bias voltage, the first current value is for fingerprint recognition; or, the first gate and the second gate synchronously receive a third control signal, so that the double gate thin film transistor is in the on state to generate a second current value for driving the organic light emitting device to carry out pixel display.

Furthermore, before the first gate and the second gate synchronously receive the first control signal, the method further comprises:

the photosensitive device synchronously receives a fourth control signal when the double gate thin film transistor is in the on state, so that the photosensitive device is in the forward bias state.

In a fifth aspect, an embodiment of the present application further provides a control method of a pixel circuit, the pixel circuit is as described in the third aspect, then the method comprises:

the first gate and the second gate synchronously receive a fifth control signal, so that the double gate thin film transistor is in an off state, meanwhile the photosensitive device receives a second control signal, so that the photosensitive device is in a reverse bias state, at this time, the photosensitive device converts an optical signal into an electric charge and accumulates the electric charge in response to the optical signal detected;

the first gate receives a third control signal, the second gate receives a fifth control signal, so that the double gate thin film transistor is in a first partial on state to lead out an electric charge as a third current value for fingerprint recognition; or, the first gate and the second gate synchronously receive the third control signal, so that the double gate thin film transistor is in an on state to generate a fourth current value for driving the organic light emitting device to carry out pixel display.

Furthermore, before the first gate and the second gate synchronously receive the fifth control signal, the method further comprises: the photosensitive device synchronously receives a fourth control signal when the double gate thin film transistor is in the first partial on state, so that the photosensitive device is in a forward bias state.

In the double gate thin film transistor provided by an embodiment of the application, one double gate thin film liquid crystal tube serves as a switch of both the photosensitive device and the organic light emitting device under the driving of different control signals, thereby greatly reducing the number of TFTs and being favorable to realize high resolution.

Furthermore, the signal intensity for fingerprint detection can be enhanced by connecting the photosensitive device with one of the gates of the double gate thin film liquid crystal tube.

According to an aspect of the present disclosure, a semiconductor apparatus is also provided, the semiconductor apparatus comprises: an active layer; a first insulating layer; a first gate and a second gate overlapping with a portion of the active layer with the first insulating layer interposed therebetween, respectively; a first electrode, a second electrode and a third electrode, the first electrode and the second electrode are electrically connected with a first portion and a second portion of the active layer, respectively, the third electrode is used to be electrically connected with a photosensitive device, wherein the third electrode is electrically connected with the first gate or the second gate; or the third electrode is electrically connected with a third portion of the active layer.

In some embodiments, the third electrode serves as one electrode of the photosensitive device.

In some embodiments, the semiconductor apparatus further comprises a second insulating layer, wherein the second insulating layer is disposed between the first, second and third electrodes and the first and second gates, the first electrode and the second electrode are electrically connected with the first portion and the second portion of the active layer via a first via and a second via passing through the first insulating layer and the second insulating layer, respectively; and the third electrode is electrically connected with the first gate or the second gate via a third via passing through the second insulating layer.

In some embodiments, the semiconductor apparatus further comprises a second insulating layer, wherein: the second insulating layer is disposed between the first, second and third electrodes and the active layer, the first electrode and the second electrode are electrically connected with the first portion and the second portion of the active layer via a first via and a second via passing through the first insulating layer and the second insulating layer, respectively; and the third electrode is electrically connected with the third portion of the active layer via a fourth via passing through the second insulating layer.

In some embodiments, the first, second and third portions are different from one another.

According to an aspect of the present disclosure, a pixel circuit is also provided, the pixel circuit comprises the semiconductor apparatus according to any of the embodiments, the photosensitive device, a light emitting device, wherein the photosensitive device is electrically connected with one of the first gate and the second gate, the light emitting device is connected to one of the first electrode and the second electrode; the semiconductor apparatus is configured to be in a sub-threshold region during a first period; the photosensitive device is configured for being in a reverse bias state in a case that a transistor in the semiconductor apparatus is in a sub-threshold region; in a case that the photosensitive device is in the reverse bias state, the photosensitive device converts an optical signal into an electric charge in response that the optical signal is detected, so as to make the one of the first gate and the second gate generate a bias voltage and to make the semiconductor apparatus generate a first current under the bias voltage.

In some embodiments, the semiconductor apparatus is configured to be in an on state during a second period to generate a second current, the second current is for driving the light emitting device.

In some embodiments, the photosensitive apparatus is further configured to be in a forward bias state in a case that the semiconductor apparatus is in an on state.

According to an aspect of the present disclosure, a pixel circuit is also provided, the pixel circuit comprises the semiconductor apparatus according to any of the embodiments, the photosensitive device, a light emitting device, wherein the photosensitive device is electrically connected with a third portion of the active layer, the light emitting device is connected to one of the first electrode and the second electrode; the semiconductor apparatus is configured to be in an off state during a third period; the photosensitive device is configured to be in a reverse bias state in a case that the semiconductor apparatus is in the off state, to convert an optical signal into an electric charge in response that the optical signal is detected; the semiconductor apparatus is further configured to lead out the electric charge as a third current when the semiconductor apparatus is in a first partial on state.

In some embodiments, the semiconductor apparatus is further configured to generate a fourth current in a case that the semiconductor apparatus is in the on state during a fourth period, the fourth current is for driving the light emitting device.

In some embodiments, the photosensitive device is further configured to be in a forward bias state in a case that the semiconductor apparatus is in the first partial on state.

In some embodiments, the semiconductor apparatus is further configured to generate a fifth current when the semiconductor apparatus is in a second partial on state, the fifth current is for driving the light emitting device.

According to an aspect of the present disclosure, a control method of a pixel circuit is also provided, the pixel circuit is as the pixel circuit according to any of the embodiments, the method comprises: receiving a first control signal by the first gate and the second gate, so as to make the semiconductor apparatus work in a sub-threshold region; receiving a second control signal by the photosensitive device, so that the photosensitive device is in a reverse bias state; in a case that the photosensitive device is in the reverse bias state, converting an optical signal into an electric charge in response to the optical signal detected by the photosensitive device, so as to make the one of the first gate and the second gate generate a bias voltage, and to make the semiconductor apparatus generate a first current under the bias voltage.

In some embodiments, the control method of the pixel circuit further comprises: receiving a third control signal by the first gate and the second gate, so that the semiconductor apparatus is in an on state to generate a second current, the second current is for driving the light emitting device.

In some embodiments, the control method of the pixel circuit further comprises: receiving a fourth control signal by the photosensitive device when the semiconductor apparatus is in the on state, so that the photosensitive device is in a forward bias state.

According to an aspect of the present disclosure, a control method of a pixel circuit is also provided, the pixel circuit is as the pixel circuit according to any of the embodiments, the method comprises: receiving a fifth control signal by the first gate and the second gate, so that the semiconductor apparatus is in an off state; receiving a second control signal by the photosensitive device so that the photosensitive device is in a reverse bias state, to convert an optical signal into an electric charge in response that the optical signal is detected; receiving a third control signal by the first gate and receiving a fifth control signal by the second gate, so that the semiconductor apparatus is in a first partial on state to lead out the electric charge as a third current.

In some embodiments, the control method of the pixel circuit further comprises: receiving the third control signal by the first gate and the second gate, so that the semiconductor apparatus is in an on state to generate a fourth current, the fourth current is for driving the light emitting device.

In some embodiments, the control method of the pixel circuit further comprises: receiving a fourth control signal by the photosensitive device in a case that the semiconductor apparatus is in the first partial on state, so that the photosensitive device is in a positive bias state.

BRIEF DESCRIPTION OF THE DRAWINGS

Other features, objectives and advantages of the present application will become more apparent upon reading of the detailed description of non-limiting embodiments made with reference to the following drawings.

DETAILED DESCRIPTION

Figure 1:
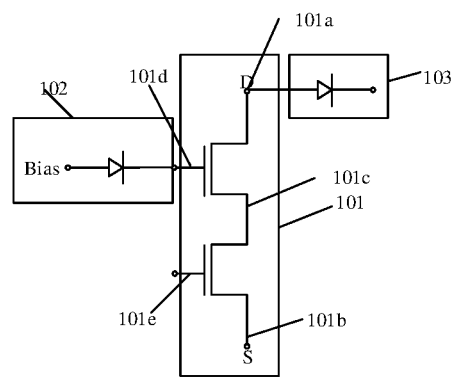
FIG. 1 shows a schematic diagram of a pixel circuit provided in an embodiment of the present application.

The present application will be described in further detail below in combination with the accompanying drawings and embodiments. It can be appreciated that specific embodiments described herein merely serve to explain the relevant disclosure, instead of limiting to the present disclosure. It should be further noted that, for the convenience of description, only the portions relevant to the present disclosure are shown in the drawings.

It should be noted that the embodiments and the features of the embodiments in the present application may be combined with each other in an appropriate case. The present application will be described in detail below with reference to the accompanying drawings in conjunction with the embodiments.

Referring to FIG. 1, FIG. 1 shows the schematic structural diagram of the pixel circuit provided in an embodiment of the present application.

As shown in FIG. 1, the pixel circuit can include the semiconductor apparatus, for example, the double gate thin film transistor 101. The pixel circuit can further include the photosensitive device 102 and the organic light emitting device 103.

The dual gate thin film transistor 101 includes the first electrode 101a, the second electrode 101b, the third electrode 101c, the first gate 101d, and the second gate 101e.

One end of the photosensitive device (such as the photodiode) 102 is electrically connected with the first gate 101d.

One end of the organic light emitting device (such as the light emitting diode) 103 is electrically connected with the first electrode 101a.

The double gate thin film transistor 101 can drive the photosensitive device 102 to work or drive the organic light emitting device 103 to work under different control signals, thereby it is implemented that one double gate thin film transistor 101 can serve not only as the switch for the photosensitive device 102 but also as the switch for the organic light emitting device 103, which effectively saves the number of the switches. In some embodiments, the photosensitive device 102 can also be electrically connected with the second gate 101e or the third electrode 101c.

The photosensitive device 102 can be a PIN photosensitive device, a PN photosensitive device, or a Schottky type photosensitive device. The photosensitive device 102 can be used for fingerprint recognition. When the finger is close to or contacts the light-emitting surface of the display apparatus, light emitted by the display apparatus is reflected back into the display apparatus, the light reflected back from the fingerprint area can be received by the photosensitive device, the optical signal is converted into the electric charge by the photosensitive device and the electric charge is read out by the data reading line. For example, the finger includes the fingerprint valley and the fingerprint ridge, magnitude of current values generated by reflected light corresponding to which in the photosensitive device are different, thereby the aim of fingerprint recognition can be implemented by identifying the magnitude of the current values.

In some embodiments, the organic light emitting device 103 can have the following structure as an example. There is the transparent ITO (indium tin oxide) anode On top of the glass substrate. the thin layer of copper phthalocyanine dye can be coated on the ITO anode, which can passivate the surface of the ITO to increase its stability. There is layers of P-type and N-type organic semiconductor material on the ITO anode, and there is the cathode on the layers of P-type and N-type organic semiconductor material, for example, the magnesium silver alloy cathode. This layer of metal cathode also achieves reflecting function. These coatings can all be evaporated onto the glass substrate and are therefore very thin in thickness. The organic light emitting material can emit relatively bright light by applying a voltage of 5~10 V across the electrodes. The light is emitted from the glass substrate, i.e., downwards. The said glass substrate can also be replaced with the flexible plastic substrate that can be bent. It should be understood that the light emitting device 103 is not limited to the embodiments shown herein, but can employ various light emitting devices known in the art or developed in the future.

By electrically connecting the photosensitive device 102 with the gate of the dual gate thin film transistor 101, it is implemented that one TFT can not only control the photosensitive device 102 for fingerprint recognition, but also control the organic light emitting device 103 to realize pixel display. Furthermore, the circuit can also utilize the bias voltage generated after the photosensitive device senses light to influence the gate voltage, so that the photosensitive device can detect the optical signal through the drain output current of the double gate thin film transistor, thereby improving the signal intensity.

Figure 2:
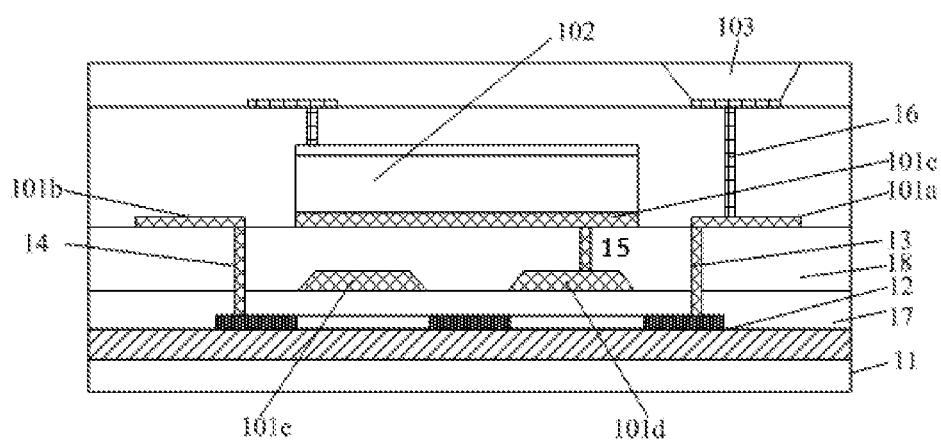
FIG. 2 shows a sectional view of a dual gate thin film transistor provided in an embodiment of the present application.

FIG. 2 shows the sectional view of the double gate thin film transistor 101 provided in some embodiments of the present application.

The double gate thin film transistor 101 can be disposed on the substrate 11. The double gate thin film transistor 101 can include: the active layer 12, the first gate 101d and the second gate 101e, and the first electrode 101a, the second electrode 101b, and the third electrode 101c.

The active layer 12 is disposed on the substrate 11.

The first electrode 101a is electrically connected with the active layer 12 via the first via 13 and the second electrode 101b is electrically connected with the active layer 12 via the second via 14, respectively. The third electrode 101c is electrically connected with the photosensitive device 102. The third electrode 101c is also electrically connected with the first gate 101d or the second gate 101e via the third via 15. The first electrode 101a is also electrically connected with the organic light emitting device 103 via the fourth via 16.

The double gate thin film transistor 101 can further include the gate insulating layer 17. The gate insulating layer (or at least a portion thereof) is disposed between the gate and the active layer. In different embodiments, the gate insulating layer 17 can be located above the active layer 12 or below the active layer 12. In the embodiment shown in FIG. 2, the gate insulating layer 17 covers the active layer 12 and also covers a partial surface of the substrate 11.

The double gate thin film transistor 101 can further include the protective layer 18. According to different implementations, the protective layer 18 can be located above the layer in which the first gate 101d and the second gate 101e are located or immediately above the active layer 12. In the embodiment shown in FIG. 2, the protective layer 18 is disposed above the gate insulating layer 17 and covers the first gate 101d and the second gate 101e.

As shown in FIG. 2, the third electrode 101c is electrically connected with the gate 101d via the path (not denoted by the reference numeral) passing through the protective layer 18. The first electrode 101a is electrically connected with a portion of the active layer 12 via the path 13 passing through the protective layer 18 and the gate insulating layer 107 and the second electrode 101b is electrically connected with a portion of the active layer 12 via the path 14 passing through the protective layer 18 and the gate insulating layer 107, respectively.

FIG. 2 also schematically shows an example of the photosensitive device 102. The photosensitive device 102 can be, for example, the photodiode. The third electrode 101c can be connected to one end of the photosensitive device 102. In an alternative implementation, the third electrode 101c can also serve as the electrode of the photosensitive device 102, for example the cathode electrode or the anode electrode of the photosensitive diode. The other end (or another electrode) of the photosensitive device 102 can be connected to other device, wiring or circuit (not shown in the figure).

FIG. 2 also schematically shows an example of the light emitting device 103. In the embodiment, the first electrode 101a is electrically connected to the light emitting device 103 via the via 16.

Figure 3A:
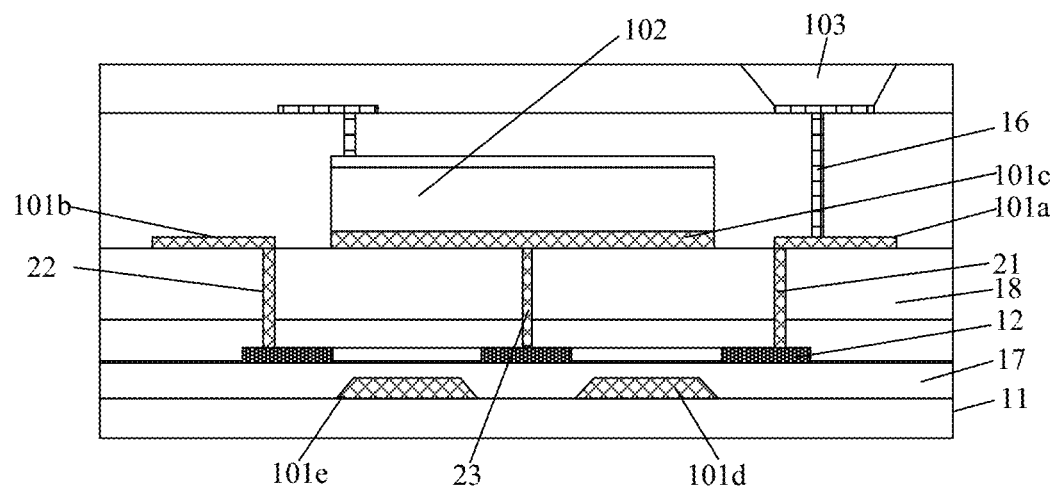
FIG. 3A shows a sectional view of a dual gate thin film transistor provided in another embodiment of the present application.
Figure 3B:
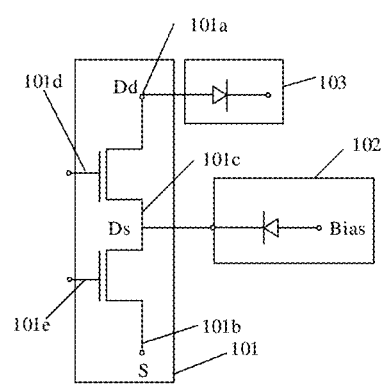
FIG. 3B shows a schematic diagram of a pixel circuit provided in another embodiment of the present application.

FIG. 3A shows the sectional view of the dual gate thin film transistor 101 provided in another embodiment of the present application; FIG. 3B shows the schematic diagram of the pixel circuit according to the embodiment. As shown in the figures, the double gate thin film transistor 101 is disposed on the substrate 11.

The double gate thin film transistor 101 according to the embodiment can include: the active layer 12, the first gate 101d and the second gate 101e, the first electrode 101a, the second electrode 101b and the third electrode 101c.

As shown in FIG. 3A, the first gate 101d and the second gate 101e are disposed on the substrate; the active layer 12 is disposed above the first gate and the second gate; the first electrode 101a, the second electrode 101b, and the third electrode 101c are disposed above the active layer. The first electrode 101a, the second electrode 101b, and the third electrode 101c are electrically connected with the active layer 12 via the fifth via 21, the sixth via 22, and the seventh via 23, respectively. The third electrode 101c is electrically connected with the photosensitive device 102. The first electrode 101a is also electrically connected with the organic light emitting device 103 via the eighth via 24.

The double gate thin film transistor 101 can further include the gate insulating layer 17. At least a portion of the gate insulating layer 17 is disposed between the first and second gates and the active layer 12. According to different embodiments, the gate insulating layer 17 can be located above the active layer 12 or below the active layer 12. In the embodiment shown in FIG. 3A, the gate insulating layer 17 covers the first gate 101d and the second gate 101e, and also covers a partial surface of the substrate 11.

The double gate thin film transistor 101 can further include the protective layer 18. According to different embodiments, the protective layer 18 can be located above the layer in which the first gate 101d and the second gate 101e are located or immediately above the active layer 12. Further, according to different embodiments, the protective layer 18 can include one or more insulating material layers. In the embodiment shown in FIG. 3A, the protective layer 18 includes two layers of dielectric material and is formed above the active layer 12 and the gate insulating layer 17.

The double gate thin film transistor 101 described above can also be adaptively modified based on bottom and top gates. For example, by extending the via or providing an additional via (not shown) on the basis of FIG. 3A, it is implemented that the photosensitive device is made to be electrically connected with the first gate or the second gate. Alternatively, for example, by changing the position of the via on the basis of FIG. 2, the photosensitive device is made to be connected with the active layer.

According to some embodiments of the present disclosure, the manufacture method of the double gate thin film transistor 101 shown in FIG. 2 is also disclosed. Taking an example that the photosensitive device is the light emitting diode PIN, the method can include the steps described below.

On the glass substrate or the flexible substrate, the buffer layer (buffer) is deposited. The buffer layer can be formed of the SiN/SiO$_2$ stack, for example, wherein a thickness of SiN is 50-150 nm, and a thickness of SiO$_2$ is 100-400 nm.

The active layer 12 is formed on the buffer layer 201. The active layer 12 can be a-Si (amorphous silicon) or p-Si (polycrystalline silicon, for example, a-Si can be crystallized to p-Si), or the oxide semiconductor active layer, for example, including Indium Gallium Zinc Oxide (IGZO), Indium Zinc Oxide (IZO), or the like. The active layer 12 can be amorphous or quasi-crystalline, crystalline. Portions of the active layer 12 in contact with the drain and the source and regions of the active layer 12 in contact with the first and second gates can be subjected to the conductive process, for example carrier concentration can be increased by doping, plasma process, atmosphere annealing, etc., so as to guarantee that the ohmic contact between the portions of the active layer and the corresponding electrodes can be implemented.

A gate insulating (GI) layer 17 and the gate layer (which includes the first gate 101d and the second gate 101e) are formed on the active layer 12. In some embodiments, the GI layer can include SiO$_2$ or SiN/SiO$_2$ stack, with a thickness of 80~150 nm; the gate layer can be metal with a thickness of 200~400 nm, for example Mo or the like. It should be understood that the materials and values shown here and in the context are exemplary only and that the present disclosure is not limited thereto.

Then, the protective layer 18 and the source-drain (SD) layer (in the present embodiment, i.e., the layer including the first electrode 101a and the second electrode 101b) are formed. In some embodiments, the protective layer is a SiO$_2$ layer or a SiN/SiO$_2$ stack with a thickness of 80~150 nm; the SD layer can be formed of metal with a thickness of 200~400 nm, for example, Mo or the like.

In an embodiment of the application, when the SD layer is prepared, the purpose of sharing the TFT SD layer and the PIN lower electrode layer can be realized at the same time. In some embodiments of the present application, the source and drain electrodes of the TFT and the lower electrode (in the present embodiment, the third electrode 101c) for the photosensitive device (e.g., PIN diode) 102 can be prepared at the same time. In other words, the source and drain electrodes of the TFT and the lower electrode for the photosensitive device (e.g., PIN diode) 102 can be prepared from the same material by the same process.

Next, various layers for the PIN diode are formed. In some embodiments, the PIN diode can include: the ITO layer, the P+ type a-Si layer, the a-Si layer and the N+ type a-Si layer. In the embodiment shown in FIG. 2, the third electrode 101c can serve as the lower electrode for the PIN diode. According to different embodiments, some layers of the PIN can be formed by PECVD. The introduction of impurities for certain layers can be formed by the in-situ doping process or by an additional doping process in case of need. In some embodiments, the P+ a-Si layer can be, for example, 10~20 nm, the a-Si layer can be 500~1000 nm, and the N+ a-Si layer can be 10~50 nm.

The ITO layer can serve as the PIN window layer. In some embodiments, the ITO layer can function as the hard mask during the PIN patterning process. In some embodiments, a thickness of the ITO layer can be 50~130 nm.

After patterning the above layers for the PIN, the planarization layer PLN is prepared. In some embodiments, the thickness of the planarization layer PLN can be slightly greater than that of the PIN, for example be 1.2~3 μm. In some embodiments, prior to forming the PLN layer, the cladding layer can also be formed at the sidewall of the functional layer of the PIN to protect the PIN sidewall. As an example, SiO, SiN or the like can be selected as the material of the cladding layer, with a thickness of about 50~150 nm.

FIG. 3A shows the manufacture process of the dual gate thin film transistor 101, wherein taking an example that the photosensitive device is the light emitting diode PIN. The process can include the steps described below.

A gate layer is formed on the glass substrate or the flexible substrate, for example a Mo layer with a thickness of 200~400 nm is used as the gate layer.

A gate insulating layer GI is formed on the gate layer, and the gate insulating layer can be made of, for example, SiN/SiO$_2$ stack, wherein a thickness of SiN can be 50~150 nm, and a thickness of SiO$_2$ can be 100~400 nm.

An active layer 12 is formed on the gate insulating layer GI. As an example, the active layer can be a-Si or p-Si, e.g., crystallized from a-Si to p-Si; alternatively, the active layer can also be an oxide active layer, for example can include indium gallium zinc oxide IGZO, indium zinc oxide IZO, or the like. According to different embodiments, the active layer 12 can be amorphous or quasi-crystalline, crystalline. The portions of the active layer 12 in contact with the source S, the drain Dd, and the drain source Ds can be subjected to the conductive process, for example, the carrier concentration can be increased by doping, plasma process, the atmosphere annealing, or the like, so as to guarantee that the ohmic contact between these portions of the active layer and the corresponding electrodes is implemented.

A first protective layer PVX1 and the source-drain (SD) layer are formed on the active layer 12. The protective layer can be $SiO_2$ or $SiN/SiO_2$ stack, with a thickness of 80~150 nm. The SD layer can be 200~400 nm metal such as Mo or the like. The source S and the drain Dd serve as electrodes for controlling switching of the pixel display function.

A second protective layer PVX2 and the drain Ds are deposited. The PVX2 can be a $SiO_2$ layer or a $SiN/SiO_2$ stack, with a thickness of 80~150 nm. Ds can be 200~400 nm metal such as Mo or the like. The source S and the drain Ds serve as electrodes for controlling switching of the photosensitive device. In some embodiments, Ds can also serve as the lower electrode of the PIN tube.

The PIN tube or the layers required thereby can then be formed. Some layers of PIN can be formed by PECVD. The introduction of impurities for certain layers can be formed by the in-situ doping process or by an additional doping process in case of need. In some embodiments, the P+ a-Si layer can be, for example, 10~20 nm, the a-Si layer can be 500~1000 nm, and the N+ a-Si layer can be 10~50 nm.

The ITO layer can serve as the PIN window layer. In addition, the ITO layer can function as the hard mask during the patterning of the PIN. In some embodiments, a thickness of the ITO layer can be 50~130 nm.

After PIN patterning, the planarization layer PLN is prepared. In some embodiments, a thickness of the planarization layer can be slightly greater than that of the PIN, for example, can be 1.2~3 μm.

Figure 4:
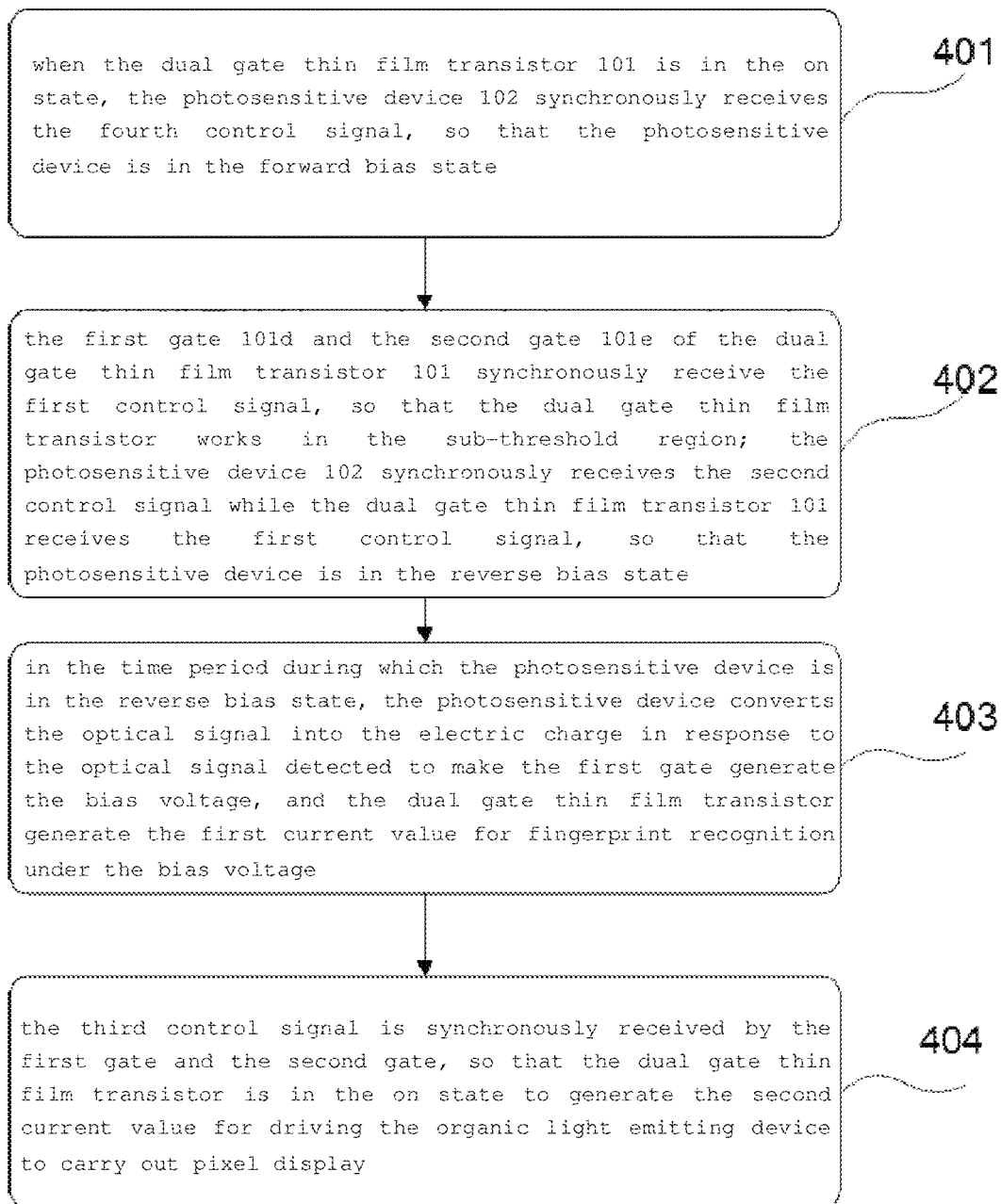
FIG. 4 shows a schematic flowchart of a control method of a pixel circuit provided in an embodiment of the present application.

FIG. 4 shows the schematic flowchart of the control method of the pixel circuit provided in an embodiment of the present application. According to the method of this embodiment, the dual gate thin film transistor 101 can be controlled to switch between controlling the photosensitive device 102 and controlling the organic light emitting device 103. As shown in FIG. 4, the method can include some or all of the following steps.

In some embodiments, the control method of the pixel circuit can be exemplarily divided into the following several stages. In the first stage, the dual gate TFT is turned on to empty the charge. In the second stage, the dual gate TFT is in the sub-threshold region (SS region). In the third stage, the photosensitive device (e.g., the PIN tube) is enabled for fingerprint detection. In the fourth stage, the light emitting device (e.g., the light emitting diode) is enabled to carry out pixel display. It should be appreciated that the control method of the pixel circuit can include one or more of the stages described above according to different implementations.

Step 401, the dual gate thin film transistor 101 is made to be turned on, so that the photosensitive device 102 receives the fourth control signal. In some embodiments, the fourth control signal can make the photosensitive device in the forward bias state. In a more specific embodiment, when the dual gate thin film transistor 101 is in the on state, the photosensitive device 102 synchronously receives the fourth control signal, so that the photosensitive device is in the forward bias state, thereby removing the charge of the PIN tube in the forward bias state. The first gate and the second gate can synchronously receive the third control signal, so as to make the dual gate thin film transistor in the on state. During this stage (i.e., the first stage) the dual gate TFT is turned on to empty the charge. The third control signal can be a first high level, for example +2V. The fourth control signal can be a second high level, for example +5V. The third control signal can be a control signal synchronously received by the first gate and the second gate.

Step 402, the first gate 101d and the second gate 101e of the dual gate thin film transistor 101 synchronously receive the first control signal, so that the dual gate thin film transistor works in the sub-threshold region. The photosensitive device 102 can synchronously receive the second control signal while the dual gate thin film transistor 101 receives the first control signal, such that the photosensitive device is in the reverse bias state. At this stage (i.e., the second stage), the dual gate TFT is in the sub-threshold region. Here, by making the TFT work in the sub-threshold region, the influence of the PIN optical signal on Id can be made sufficiently large, so as to improve the signal intensity and simplify the circuit structure. In some embodiments, the first control signal can be a voltage of 0V. The second control signal can be -5V. The first control signal can be a control signal synchronously received by the first gate and the second gate.

Step 403, in the time period during which the photosensitive device is in the reverse bias state, the photosensitive device converts the optical signal into the electric charge to make the first gate generate the bias voltage in response to the detected optical signal, and make the dual gate thin film transistor to generate the first current value for fingerprint recognition under the bias voltage. Fingerprint detection is achieved at this stage (i.e., the third stage) using the PIN tube. Taking the circuit structure shown in FIG. 2 as an example, when the first gate 101d and the second gate 101e synchronously receive the control signal of a voltage of 0V, the dual gate thin film transistor 101 works in the sub-threshold region. At this time, the photosensitive device 102 is controlled by a voltage signal of -5V to be in the reverse bias state. In the process of the reverse bias state, if there is the finger pressing on the display apparatus, light of the finger is reflected onto the photosensitive device; due to different reflection degrees to the light of textures on the finger, bias voltage values generated by the photosensitive device in the reverse bias state by accumulating charge are different, further, under the influence of the bias voltage values, the voltage of the first gate 101d of the double gate thin film transistor connected with the photosensitive device presents the negative value; the generated negative voltage values are different depending on the quantity of the charge, and under the action of the negative voltage values, the first current value is output at the first electrode 101a and the current value can be used for fingerprint detection.

Step 404, the third control signal is synchronously received by the first gate and the second gate, so that the dual gate thin film transistor is in the on state to generate the second current value. The second current value can be used to drive the organic light emitting device to carry out pixel display. In some embodiments, the third control signal can be +2V. Pixel display is performed at this stage (i.e., the fourth stage). With the circuit structure shown in FIG. 2, when the first gate 101d and the second gate 101e synchronously receive the voltage control signal of +2V, the dual gate thin film transistor 101 is made to be turned on, the image signal can be input through the second electrode 101b, and the second current value for driving the organic light emitting device 103 to carry out pixel display can be output through the first electrode 101a, thereby implementing the display function.

Figure 5:
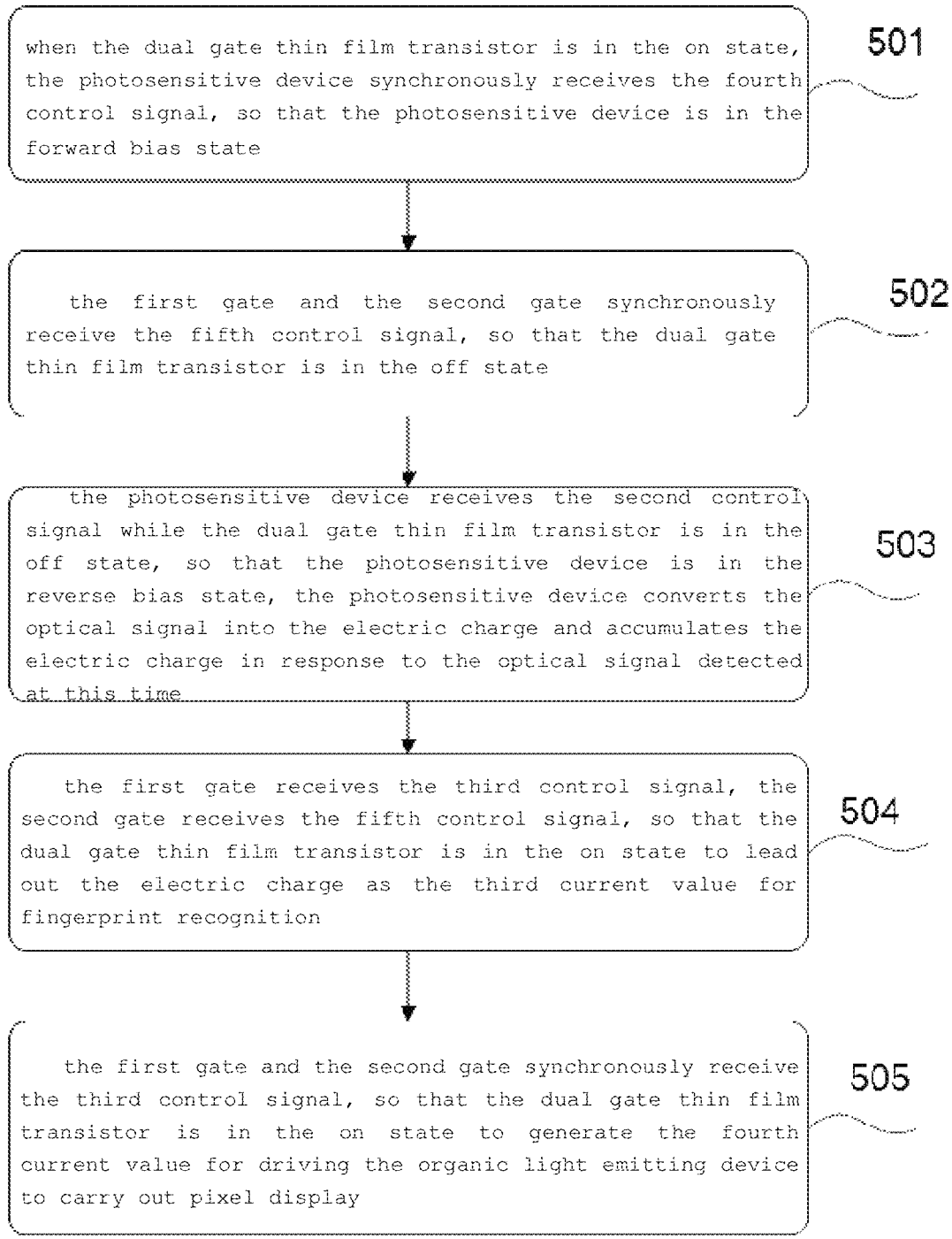
FIG. 5 shows a schematic flowchart of a control method of a pixel circuit provided in another embodiment of the present application.

As shown in FIG. 5, FIG. 5 shows the schematic flowchart of the control method of the pixel circuit provided in another embodiment of the present application. The pixel circuit can be as shown in FIG. 3A. The dual gate thin film transistor 101 is controlled to switch between the photosensitive device 102 and the organic light emitting device 103.

Step 501, when the dual gate thin film transistor is in the first partial on state, the photosensitive device receives the fourth control signal synchronously, so that the photosensitive device is in the forward bias state. The dual gate thin film transistor 101 can be made to be in the first partial on state by receiving the third control signal by the first gate and receiving the fifth control signal by the second gate. In some embodiments, the third control signal can be a voltage of +2V, the fourth control signal can be a voltage of +5V, and the fifth control signal can be a voltage of −2V. At this stage (i.e., the first stage) the dual gate TFT turns on to empty the charge. The first partial on state can be understood as partial on of the dual gate thin film transistor, for example, taking the circuit structure shown in FIG. 3A as an example, when the first gate 101*d* receives a voltage of +2V and the second gate 101*e* receives a voltage of −2V, the channel can be formed between the first electrode 101*a* and the third electrode 101*c* under the control of electric field of the first gate, so that the charge of the PIN tube in forward bias is removed. The second portion of the dual gate TFT controlled by the second gate 101*e* is in the off state. There is no limitation to the said first and second portions, and in other embodiments, the first and second portions can be interchanged so long as they operate in accordance with the principle taught in the present application. For example, the first gate 101*d* can receive a voltage of −2V, and the second gate 101*e* can receive a voltage of +2V as well; in this case, the portion defined by the second gate 101*e*, the second electrode 101*b*, and the third electrode 101*c* can serve as the first portion, and the portion defined by the first gate 101*d*, the first electrode 101*a*, and the third electrode 101*c* can serve as the second portion.

Step 502, the first gate and the second gate synchronously receive the fifth control signal, so that the dual gate thin film transistor is in the off state. At this stage (i.e., the second stage), the dual gate TFT switch is off.

Step 503, while the dual gate thin film transistor is in the off state, the photosensitive device receives the second control signal, so that the photosensitive device is in the reverse bias state, and at this time, the photosensitive device converts the optical signal into the electric charge and accumulates the electric charge in response to the detected optical signal.

Step 504, the first gate receives the third control signal, and the second gate receives the fifth control signal, so that the dual gate thin film transistor is in the first partial on state to lead out the electric charge as the third current value. The third current value can be used for fingerprint recognition. Taking the circuit structure shown in FIG. 3A as an example, when the first gate 101*d* receives a voltage of +2V, the channel is formed between the first electrode 101*a* and the third electrode 101*c*, the charge accumulated by the PIN are led out to the first electrode 101*a*, and the first electrode 101*a* outputs the third current value for fingerprint recognition. Steps 503 and 504 are the third stage at which fingerprint detection is achieved using the PIN tube. Similarly, the first and second portions are not limited, and in other embodiments, the portion defined by the second gate 101*e*, the second electrode 101*b*, and the third electrode 101*c* can serve as the first portion, and the portion defined by the first gate 101*d*, the first electrode 101*a*, and the third electrode 101*c* can serve as the second portion.

Step 505, the first gate and the second gate synchronously receive the third control signal, so that the dual gate thin film transistor is in the on state to generate the fourth current value. The fourth current value can be used to drive the organic light emitting device to carry out pixel display. The pixel display is carried out at this stage (i.e., the fourth stage). Taking the circuit structure shown in FIG. 3A as an example, when the first gate 101*d* and the second electrode 101*e* receive a voltage of +2V, the channel is formed between the first electrode 101*a* and the second electrode 101*b*, the image signal is input through the second electrode 101*b*, and the fourth current value output by the first electrode 101*a* is used for driving the organic light emitting device to carry out pixel display.

At the fourth stage, the pixel display can also be controlled by receiving the control signal only at the second gate, so that the first gate and the first and third electrodes serve as the single-gate TFT.

Figure 6:
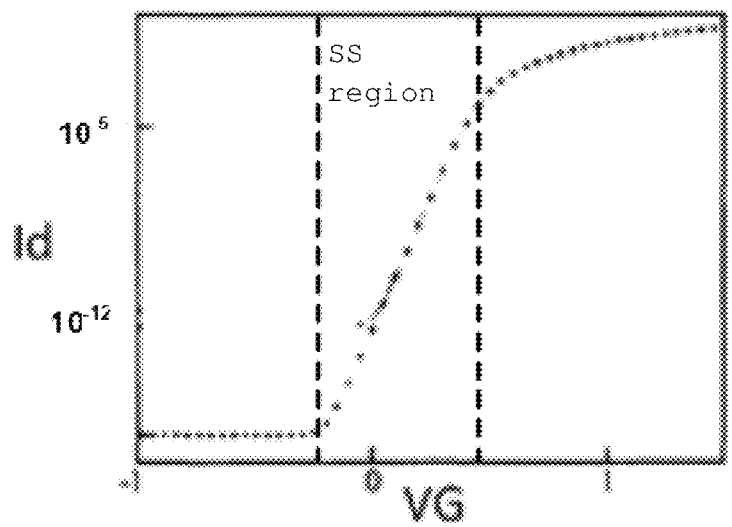
FIG. 6 shows an Id-Vg curve of a transistor according to some embodiments of the present disclosure.
Figure 7:
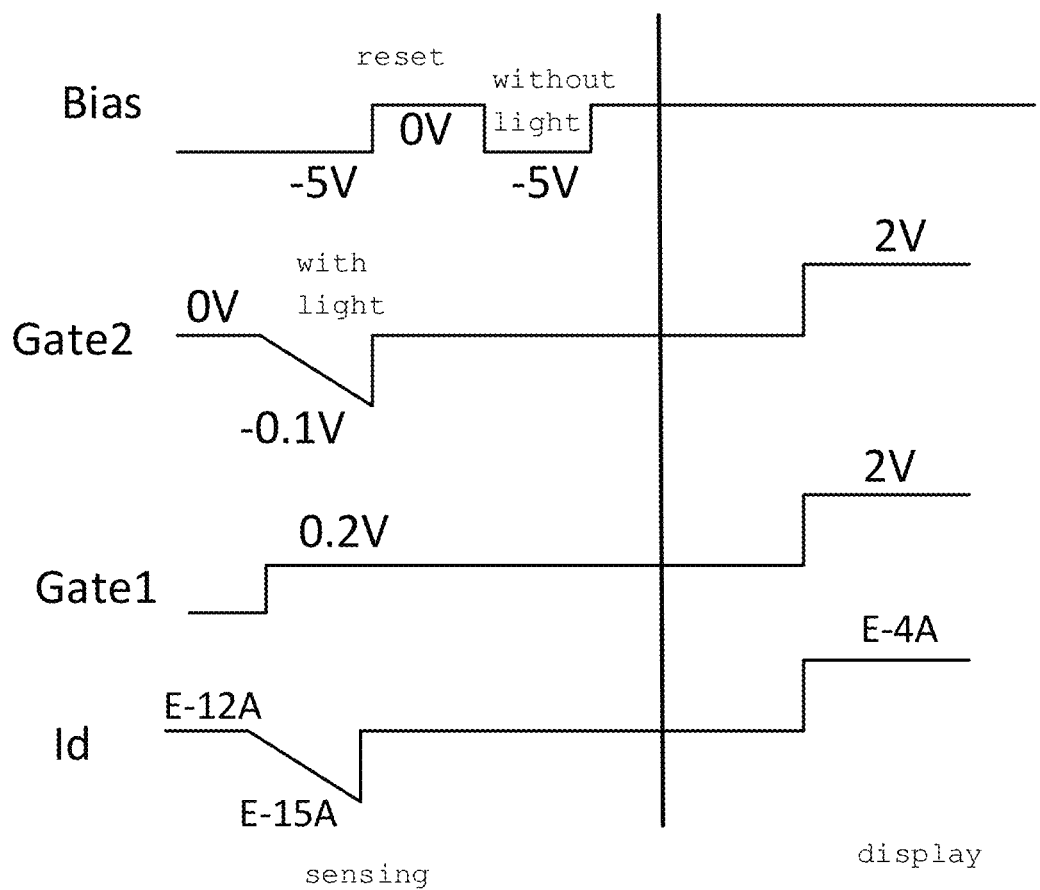
FIG. 7 shows a timing diagram for an exemplary operation of the transistor.

FIG. 6 shows the Id-Vg curve of the transistor according to some embodiments of the present disclosure, and FIG. 7 shows the timing diagram for an exemplary operation of the transistor. The transistor can be a double gate transistor according to any of the above embodiments of the present disclosure.

Taking the dual Gate TFT with the Id-VG curve as shown in FIG. 6 as an example, the first voltage (e.g., 2V) is applied at the first Gate (Gate 1, e.g., 101) and the second Gate to turn on the TFT, and the voltage (e.g., 5V) is applied at Bias to make the PIN to be positively biased, to remove the residual charge in the PIN.

Then, as shown in FIG. 7, the second voltage (e.g., 0.2V) is applied at the first gate, the third voltage (e.g., 0V) is applied at the second gate to make the TFT to be in the sub-threshold swing region (SS region, see FIG. 6), and the voltage (e.g., −5V) is applied at Bias to make the PIN to be reversely biased.

After light reception, charge is accumulated in the PIN and the bias voltage is generated, and then the electric potential of the second gate is changed, e.g., to −0.1V. The resulting change in Id in the SS region is, e.g., E-12A→E-15A, which exhibits the effect of the photo-generated bias voltage.

When the voltage applied to Bias becomes 0V, PIN is then positively biased and discharged, and has the reset effect.

Then, in the absence of illumination, the TFT is considered to be unaffected, and Id is the current under the corresponding gate voltage in the SS region. Taking an oxide semiconductor TFT as an example, the ratio Ion/Ioff of the on current (Ion) to the off current (Ioff) of the TFT is E-5/E-14=E9. And for the amorphous silicon (e.g., a-Si:H) PIN, illumination current Iphoto/dark state current Idark is E-9/E-14=E5. Thus, according to the embodiments of the present application, the signal strength is about 4 orders of magnitude greater than that of the conventional PIN.

In FIG. 7, on left side of the vertical line shown is the sensor sensing work area, and on right side is the display work area. When the display operation is required, the voltage is applied at the first gate and the second gate (for example, a voltage of 2V is applied to both gates) so that the TFT is completely in the on-operation region (for example, in the right side region of the SS region in FIG. 6), the change in gate voltage due to the voltage difference (about 0.1V) generated by the PIN has the negligible effect on Id. In the TFT turn on region, for example the voltage changes from 2V to 1.9V, Id is in the saturation region and thus no corresponding change occurs. At this time, the PIN will not affect the display effect. According to the embodiment of the present application, display and sensing can be separately controlled by one TFT.

The above description is only the preferred embodiments of the present application and the illustration of the technical principle employed. It should be appreciated by those skilled in the art that the scope of the disclosure involved in the present application is not limited to the technical solution formed from particular combinations of the technical features described above, but also encompasses other technical solutions formed from any combination of the technical features described above or their equivalents without departing from the conception of the present disclosure, for example, technical solutions formed by replacing the above features with technical features having similar functions disclosed in the present application (but not limited thereto).

What is claimed is:

1. A semiconductor apparatus comprising:
an active layer;
a first insulating layer;
a first gate overlapping with a portion of the active layer with the first insulating layer interposed therebetween and a second gate overlapping with a portion of the active layer with the first insulating layer interposed therebetween, respectively; and
a first electrode, a second electrode, and a third electrode, the first electrode is electrically connected with a first portion of the active layer and the second electrode is electrically connected with a second portion of the active layer, respectively, the third electrode is used to be electrically connected with a photosensitive device, wherein the third electrode is electrically connected with one of following:
the first gate, the second gate, or, a third portion of the active layer, and
wherein the third electrode serves as one electrode of the photosensitive device,
the semiconductor apparatus further comprising a second insulating layer, wherein:
the second insulating layer is disposed between the first, second, and third electrodes and the first and second gates;
the first electrode is electrically connected with the first portion of the active layer through a first via passing through the second insulating layer and the second electrode is electrically connected with the second portion of the active layer through a second via passing through the second insulating layer, respectively; and
the third electrode is electrically connected with the first gate or the second gate through a third via passing through the first insulating layer and the second insulating layer.

2. The semiconductor apparatus according to claim 1, wherein the first, second and third portions are different from one another.

3. A semiconductor apparatus comprising:
an active layer;
a first insulating layer;
a first gate overlapping with a portion of the active layer with the first insulating layer interposed therebetween and a second gate overlapping with a portion of the active layer with the first insulating layer interposed therebetween, respectively; and
a first electrode, a second electrode, and a third electrode, the first electrode is electrically connected with a first portion of the active layer and the second electrode is electrically connected with a second portion of the active layer, respectively, the third electrode is used to be electrically connected with a photosensitive device, wherein the third electrode is electrically connected with one of following:
the first gate, the second gate, or, a third portion of the active layer, and
wherein the third electrode serves as one electrode of the photosensitive device,
the semiconductor apparatus further comprising a second insulating layer, wherein:
the second insulating layer is disposed between the first, second, and third electrodes and the active layer;
the first electrode is electrically connected with the first portion of the active layer through a first via passing through the first insulating layer and the second insulating layer and the second electrode is electrically connected with the second portion of the active layer through a second via passing through the first insulating layer and the second insulating layer; and
the third electrode is electrically connected with the third portion of the active layer through a third via passing through the second insulating layer.

4. The semiconductor apparatus according to claim 3, wherein the first, second, and third portions are different from one another.

5. A pixel circuit comprising:
a semiconductor apparatus comprising:
an active layer;
a first insulating layer;
a first gate overlapping with a portion of the active layer with the first insulating layer interposed therebetween and a second gate overlapping with a portion of the active layer with the first insulating layer interposed therebetween, respectively; and
a first electrode, a second electrode, and a third electrode, the first electrode is electrically connected with a first portion of the active layer and the second electrode is electrically connected with a second portion of the active layer, respectively, the third electrode is used to be electrically connected with a photosensitive device, wherein the third electrode is electrically connected with the first gate or the second gate, or, the third electrode is electrically connected with a third portion of the active layer;
the photosensitive device; and
a light emitting device,
wherein:
the photosensitive device is electrically connected with one of the first gate and the second gate, the light emitting device is connected to one of the first electrode and the second electrode;
the semiconductor apparatus is configured to be in a sub-threshold region during a first period;
the photosensitive device is configured for being in a reverse bias state in a case that a transistor in the semiconductor apparatus is in the sub-threshold region; and
in a case that the photosensitive device is in the reverse bias state, the photosensitive device converts an optical signal into an electric charge in response that the optical signal is detected, so as to make the one of the first gate and the second gate generate a bias voltage and to make the semiconductor apparatus generate a first current under the bias voltage.

6. The pixel circuit according to claim 5, wherein the semiconductor apparatus is configured to be in an on state during a second period to generate a second current, the second current is for driving the light emitting device.

7. The pixel circuit according to claim 6, wherein the photosensitive device is further configured to be in a forward bias state in a case that the semiconductor apparatus is in the on state.

8. A control method of a pixel circuit according to claim 5 the method comprising:
receiving a first control signal by the first gate and the second gate, so that the semiconductor apparatus works in the sub-threshold region;
receiving a second control signal by the photosensitive device, so that the photosensitive device is in the reverse bias state; and
in the case that the photosensitive device is in the reverse bias state, converting the optical signal into the electric charge by the photosensitive device in response to the optical signal detected, so as to make the one of the first gate and the second gate generate the bias voltage, and make the semiconductor apparatus generate the first current under the bias voltage.

9. The control method of the pixel circuit according to claim 8, further comprising:
receiving a third control signal by the first gate and the second gate, so that the semiconductor apparatus is in an on state to generate a second current, the second current is for driving the light emitting device.

10. The control method of the pixel circuit according to claim 8, further comprising:
receiving a third control signal by the photosensitive device when the semiconductor apparatus is in an on state, so that the photosensitive device is in a forward bias state.

11. The pixel circuit according to claim 5, wherein the semiconductor apparatus further comprises a second insulating layer, and wherein:
the second insulating layer is disposed between the first, second, and third electrodes and the first and second gates;
the first electrode is electrically connected with the first portion of the active layer through a first via passing through the second insulating layer and the second electrode is electrically connected with the second portion of the active layer through a second via passing through the second insulating layer, respectively; and
the third electrode is electrically connected with the first gate or the second gate through a third via passing through the first insulating layer and the second insulating layer.

12. The pixel circuit according to claim 5, wherein the semiconductor apparatus further comprising a second insulating layer, and wherein:
the second insulating layer is disposed between the first, second, and third electrodes and the active layer;
the first electrode is electrically connected with the first portion of the active layer through a first via passing through the first insulating layer and the second insulating layer and the second electrode is electrically connected with the second portion of the active layer through a second via passing through the first insulating layer and the second insulating layer; and
the third electrode is electrically connected with the third portion of the active layer through a third via passing through the second insulating layer.

13. A pixel circuit comprising:
a semiconductor apparatus comprising:
an active layer;
a first insulating layer;
a first gate overlapping with a portion of the active layer with the first insulating layer interposed therebetween and a second gate overlapping with a portion of the active layer with the first insulating layer interposed therebetween, respectively; and
a first electrode, a second electrode, and a third electrode, the first electrode is electrically connected with a first portion of the active layer and the second electrode is electrically connected with a second portion of the active layer, respectively, the third electrode is used to be electrically connected with a photosensitive device, wherein the third electrode is electrically connected with the first gate or the second gate, or, the third electrode is electrically connected with a third portion of the active layer,
the photosensitive device; and
a light emitting device,
wherein the photosensitive device is electrically connected with the third portion of the active layer, the light emitting device is connected to one of the first electrode and the second electrode;
the semiconductor apparatus is configured to be in an off state during a first period;
the photosensitive device is configured to be in a reverse bias state in a case that the semiconductor apparatus is in the off state, to convert an optical signal into an electric charge in response that the optical signal is detected;
the semiconductor apparatus is further configured to lead out the electric charge as a first current when the semiconductor apparatus is in a first partial on state.

14. The pixel circuit according to claim 13, wherein the semiconductor apparatus is further configured to generate a second current in a case that the semiconductor apparatus is in an on state during a second period, the second current is for driving the light emitting device.

15. The pixel circuit according to claim 13, the photosensitive device is further configured to be in a forward bias state in a case that the semiconductor apparatus is in the first partial on state.

16. The pixel circuit according to claim 13, the semiconductor apparatus is further configured to generate a second current when the semiconductor apparatus is in a second partial on state, the second current is for driving the light emitting device.

17. A control method of a pixel circuit according to claim 13 the method comprising:
receiving a first control signal by the first gate and the second gate, so that the semiconductor apparatus is in the off state;
receiving a second control signal by the photosensitive device, so that the photosensitive device is in the reverse bias state to convert the optical signal into the electric charge in response that the optical signal is detected; and
receiving a third control signal by the first gate and receiving the first control signal by the second gate, so that the semiconductor apparatus is in the first partial on state to lead out the electric charge as the first current.

18. The control method of the pixel circuit according to claim 17, further comprising:
receiving the third control signal by the first gate and the second gate, so that the semiconductor apparatus is in an on state to generate a second current, the second current is for driving the light emitting device.

19. The pixel circuit according to claim 13, wherein the semiconductor apparatus further comprises a second insulating layer, and wherein:

the second insulating layer is disposed between the first, second, and third electrodes and the first and second gates;

the first electrode is electrically connected with the first portion of the active layer through a first via passing through the second insulating layer and the second electrode is electrically connected with the second portion of the active layer through a second via passing through the second insulating layer, respectively; and the third electrode is electrically connected with the first gate or the second gate through a third via passing through the first insulating layer and the second insulating layer.

20. The pixel circuit according to claim 13, wherein the semiconductor apparatus further comprising a second insulating layer, and wherein:

the second insulating layer is disposed between the first, second, and third electrodes and the active layer;

the first electrode is electrically connected with the first portion of the active layer through a first via passing through the first insulating layer and the second insulating layer and the second electrode is electrically connected with the second portion of the active layer through a second via passing through the first insulating layer and the second insulating layer; and the third electrode is electrically connected with the third portion of the active layer through a third via passing through the second insulating layer.

* * * * *